United States Patent [19]

Wakatsuki et al.

[11] 4,420,730
[45] Dec. 13, 1983

[54] SURFACE ACOUSTIC WAVE FILTER

[75] Inventors: Noboru Wakatsuki; Yuji Kojima; Masaaki Ono, all of Kawasaki, Japan

[73] Assignee: Fujitsu Limited, Kawasaki, Japan

[21] Appl. No.: 314,430

[22] Filed: Oct. 23, 1981

[30] Foreign Application Priority Data

Oct. 25, 1980 [JP] Japan ................... 55-148881

[51] Int. Cl.³ .................. H03H 9/64; H03H 9/70
[52] U.S. Cl. .................... 333/195; 333/196
[58] Field of Search ............... 333/193–196, 333/150–155; 310/313 R, 313 A, 313 B, 313 C, 313 D; 358/30–31, 36–38, 904–905

[56] References Cited

U.S. PATENT DOCUMENTS

4,254,387  3/1981  Redwood et al. .......... 310/313 B X

Primary Examiner—Marvin L. Nussbaum
Attorney, Agent, or Firm—Staas & Halsey

[57] ABSTRACT

A surface acoustic wave filter which comprises: a substrate of piezoelectric material; a multistrip coupler for changing the track of a signal comprising a plurality of parallel conductive strips; at least two transducers disposed on one side of the multistrip coupler; at least another two transducers disposed on the other side of the multistrip coupler. The latter two transducers facing the former two transducers. One pair of the transducers which face each other through the multistrip coupler constitutes input transducers while the other pair of the transducers constitutes output transducers.

14 Claims, 16 Drawing Figures

Fig. 7 PRIOR ART (MHz)

SURFACE ACOUSTIC WAVE FILTER

FIELD OF THE INVENTION

The present invention relates to a surface acoustic wave filter, especially to a surface acoustic wave filter used in a TV set for filtering a wave band of a TV signal of intermediate frequency.

BACKGROUND OF THE INVENTION

A surface acoustic wave filter is used in a TV set for filtering a wave band of a TV signal of intermediate frequency so as to achieve easy control of the wave band and thus reduce the number of parts in a TV set.

A different wave band frequency is used for each channel for transmitting a TV signal. The TV signal is picked up by an antenna and passes through a filter circuit so as to be conveyed as a picture signal and a sound signal which are introduced into the TV receiver. The TV receiver comprises one common filter for all channels instead of providing one specific filter for each channel. This common filter is used for filtering a wave band of intermediate frequency which is lower than the frequency of the wave band for each channel. The wave band for each channel is shifted down to the common wave band of intermediate frequency at the time of changing the channel, so that a picture signal and a sound signal of each channel can be picked up through the common filter. A surface acoustic wave filter is used as the common filter.

Figure 1:
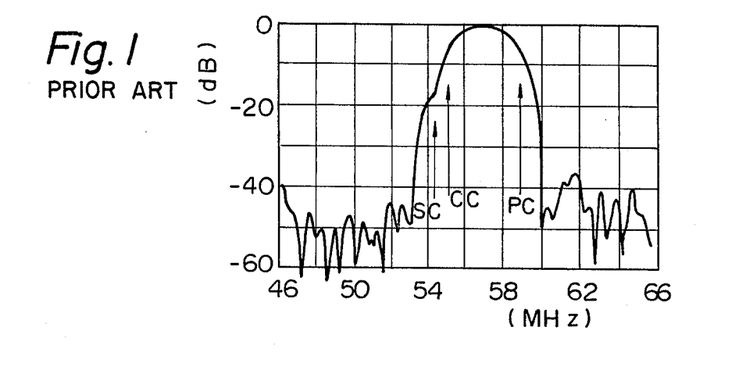
FIG. 1 is a graphical view of a frequency characteristic of a surface acoustic wave filter for a TV signal of intermediate frequency according to a known prior art.

A surface acoustic wave filter of the prior art with a wave band of intermediate frequency used in a TV receiver has a characteristic frequency which allows it to pass chroma carrier waves (c.c) of 55.17 MHZ, picture carrier waves (p.c) of 58.75 MHZ and sound carrier waves (s.c) of 54.25 MHZ for TV broadcasting in Japan, as shown in FIG. 1.

Figure 2:
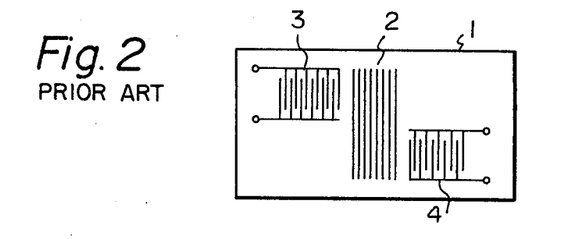
FIG. 2 is a plan view of the surface acoustic wave filter of the prior art which has a characteristic as illustrated in FIG. 1.

An example of such a surface acoustic wave filter is illustrated in FIG. 2. The surface acoustic wave filter comprises an input transducer 3 and an output transducer 4 formed on a substrate 1 of piezoelectric material. A multistrip coupler 2 comprising a plurality of conductive strip patterns is disposed between the input transducer 3 and the ouput transducer 4 so as to shift the wave track in order to improve the filtering ability.

Transfer efficiency of the wave from the track of input transducer 3 to the track of output transducer 4 is determined by the number of the parallel conductive strip patterns and the distance between any two adjacent patterns on the piezoelectric substrate 1. By disposing the multistrip coupler, an output transducer 4 is necesserily placed on the shifted position which is set off from the position facing the input transducer 3. Therefore, unnecessary bulk waves which advance straight within the substrate 1 from the input transducer 3 are not introduced into the output transducer 4.

Each of the transducers 3, 4 comprises a pair of comb shaped electrodes formed on the piezoelectric substrate 1 and interdigitated with each other. The characteristic of the filter depends upon the length of each tooth of the electrodes and the superposed length of adjacent teeth of the facing comb shaped electrodes. Therefore, by appropriately forming the comb, the desired characteristic of the filter corresponding to the picture and sound carriers can be obtained. The above mentioned method of obtaining the picture carrier and the sound carrier from the same wave signal of intermediate frequency is called an inter carrier system. In such an inter carrier system using the surface acoustic wave filter of the prior art, the sound signal and the picture signal are apt to be modulated and deformed, since the sound carrier, the chroma carrier and the picture carrier pass through one and the same filter so as to be amplified and detected.

Another method of obtaining the sound signal and the picture signal is called a split carrier method. A split carrier method using two completely separate filters requires a complicated filter circuit increasing the cost. Therefore, in another split carrier method, in order to obviate the above drawbacks, the sound signal and the picture signal are separated while passing through one common circuit.

Figure 3:
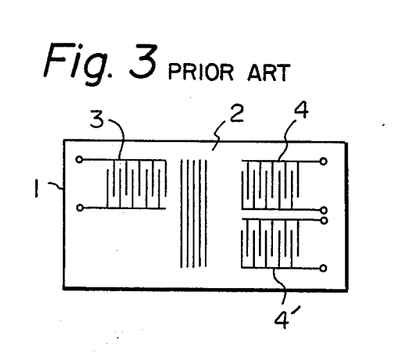
FIG. 3 is a plan view of a surface acoustic wave filter comprising three transducers according to known prior art.
Figure 4:
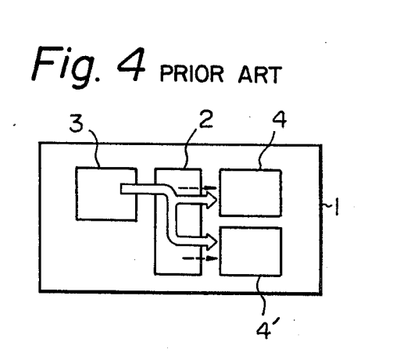
FIG. 4 is a view for explaining the function of the surface acoustic wave filter of FIG. 3.
Figure 7:
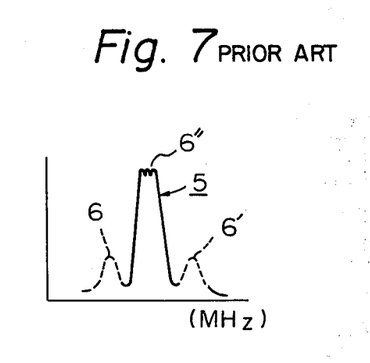
FIG. 7 is a graphical view of the characteristic of the surface acoustic wave filter of FIG. 3 or 5.

An example of surface acoustic wave filter of the split carrier method of the prior art is illustrated in FIG. 3. This surface acoustic wave filter comprises a multistrip coupler 2 which changes one half of input wave power to another track and is formed on a substrate of piezoelectric material, an input transducer 3, formed on one side of the multistrip coupler 2 and two output transducers 4, 4' formed on the other side of the multistrip coupler 2. The input transducer 3 has wide band response corresponding to both transducers 4 and 4'. A signal from the input transducers 3 is transmitted to each of the output transducers 4, 4' through the multistrip coupler 2, as shown by the large outline arrows in FIG. 4. The picture signal and the sound signal can be separated by passing the input signal through the output transducers 4, 4', each of which transducers has a different characteristic. In such an arrangement, modulation of the picture signal and the sound signal can be avoided, the number of parts can be reduced and easy control of the signal can be achieved. However, in this arrangement, unnecessary waves which advance within the substrate 1 from the input transducer 3 enter the output transducers 4, 4' as shown by the dotted arrows in FIG. 4. Thus, as shown in FIG. 7, unnecessary waves 6, 6' appear on both sides of the desired wave 5 which corresponds to the characteristic of the filter. Also, adverse ripples 6" appear in the passing range of frequency of the filter as shown in FIG. 7.

These unnecessary waves 6, 6', 6" appear due to the bulk waves which advance straight within the substrate 1 and leak of acoustic wave during passing through the multistrip coupler from the input transducer 3 to the output transducer 4 or 4'. Also, a problem of transmission loss due to the insertion of the multistrip coupler arises in addition to the above disadvantages due to the unnecessary waves 6, 6' and 6".

Figure 5:
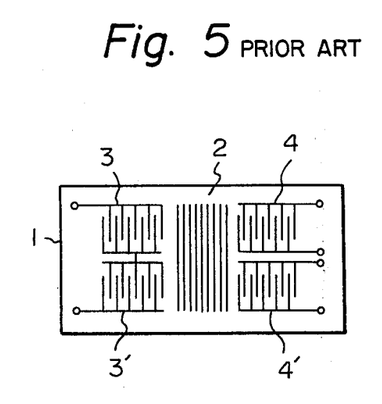
FIG. 5 is a plan view of a surface acoustic wave filter comprising four transducers according to known prior art.
Figure 6:
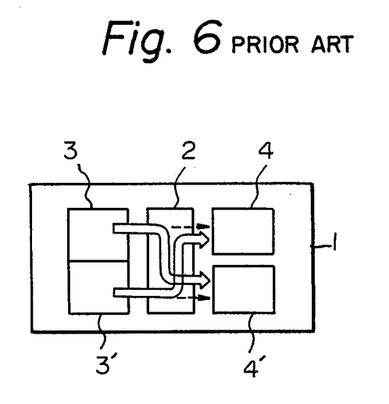
FIG. 6 is a view for explaining the function of the surface accoustic wave filter of FIG. 5.

Another example of surface acoustic wave filter of the split carrier type of the prior art is illustrated in FIG. 5. This surface acoustic wave filter comprises a multistrip coupler 2, two input transducers 3, 3' formed on one side of the multistrip coupler 2 and two output transducers 4, 4' formed on the other side of the multistrip coupler 2. The two input transducers 3, 3' are electrically connected in series with each other. A signal from each of the input transducers 3, 3' is transmitted to each of the output transducers 4, 4' through the multistrip coupler 2, as shown by the large outline arrows in FIG. 6. The picture signal and the sound signal can be separated by passing the input signals through the output transducers 4, 4', each of which transducers has a different characteristic. However, in such an arrangement, unnecessary waves 6, 6' and 6" similarly appear, as shown in FIG. 7, in the same manner as the former example.

The present invention was made in order to obviate these drawbacks of the prior art.

SUMMARY OF THE INVENTION

A surface acoustic wave filter according to the present invention comprises: a substrate of piezoelectric material; a multistrip coupler for changing the track of a signal comprising a plurality of parallel conductive strips; at least two transducers disposed on one side of the multistrip coupler; at least another two transducers disposed on the other side of the multistrip coupler, the latter two transducers facing the former two transducers; in which one pair of said transducers which face each other through the multistrip coupler constitute input transducers while the other pair of the transducers constitute output transducers.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 10($a$) and 10($b$) are graphical views of frequency characteristics of an example of the surface acoustic wave filter according to the present invention.

FIGS. 12($a$) and 12($b$) are graphical views of frequency characteristics of the surface acoustic wave filter according to the present invention.

DETAILED DESCRIPTION OF EMBODIMENTS OF THE INVENTION

Embodiments of the present invention will now be described with reference to the accompanying drawings.

Figure 8:
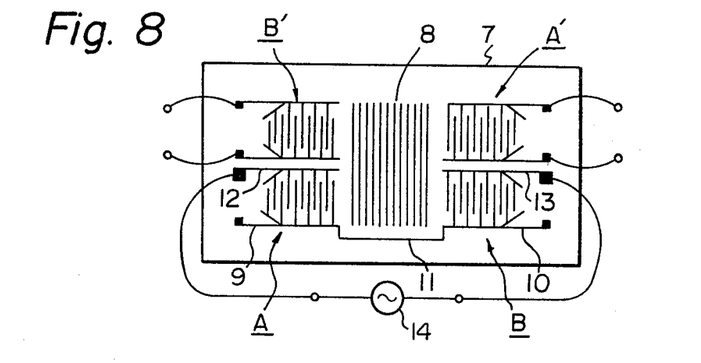
FIG. 8 is a plan view of an embodiment of the surface acoustic wave filter according to the present invention.
Figure 10A:
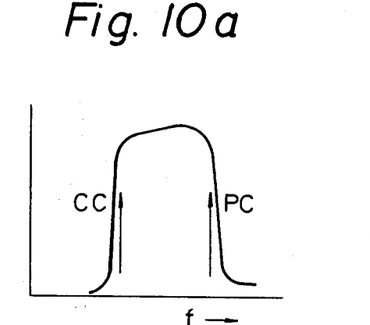
Figure 10B:
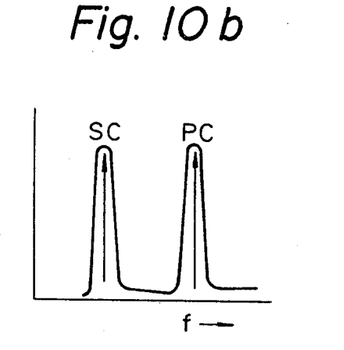

A first embodiment of the present invention is illustrated in FIG. 8. A multistrip coupler 8 is formed on a substrate 7 of piezoelectric material. Two transducers A, B' are disposed on one side of the multistrip coupler 8. Another two transducers A', B are disposed on the other side of the multistrip coupler 8. The latter two transducers A', B face the former two transducers A, B'. One pair of said transducers A and B which face each other through the multistrip coupler 8 constitute input transducers. The other pair of said transducers A' and B' constitute output transducers. An electrode terminal 9 of the input transducer A and an electrode terminal 10 of the other transducer B are electrically interconnected through a connection pattern 11. Therefore, the other electrode terminal 12 of the input transducer A and the other electrode terminal 12 of the other input transducer A and the other electrode terminal 13 of the other input transducer B are interconnected through the capacity of the comb shaped electrodes of the transducers and the pattern 11. An input signal 14 is introduced between the electrode terminal 12 of the input transducer A and the electrode terminal 13 of the other input electrode B. The input signal from the input transducer A is transmitted through the multistrip coupler 8 to the output transducer A' which emits an output signal therefrom. The input signal from the other input transducer B is transmitted through the multistrip coupler 8 to the other output transducer B' which emits another output signal. A set of input and output transducers A, A' has a filtering characteristic, as represented in FIG. 10($a$) so as to obtain a picture signal which comprises the chroma carrier band and the picture carrier band. Such a characteristic can be obtained by appropriately forming the teeth of the comb-shaped electrodes of the transducers. The other set of input and output transducers B, B' has a filtering characteristics as represented in FIG. 10($b$) so as to obtain a sound signal which comprises the sound carrier band and the picture carrier band. Unnecessary bulk waves emitted from the input transducers A, B do not enter the output transducers A', B', since the bulk waves go straight through the substrate.

Figure 11:
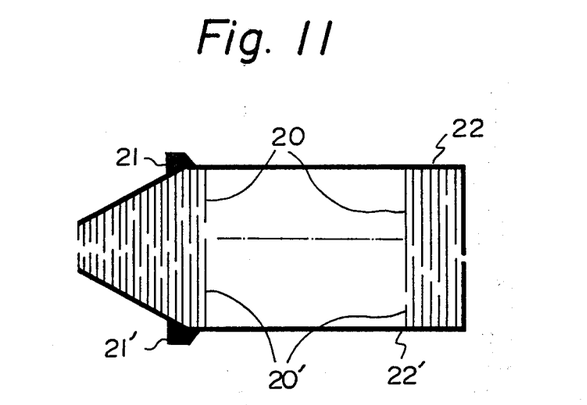
FIG. 11 is a plan view of a transducer used in the present invention.
Figure 12A:
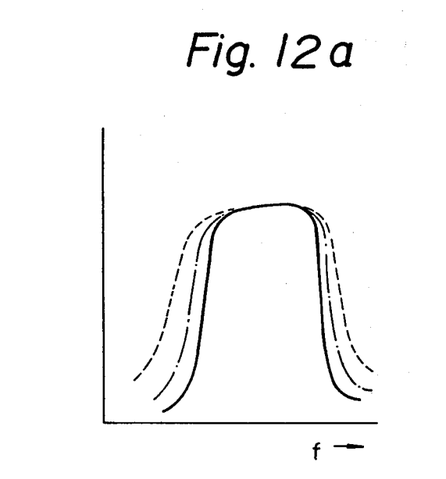
Figure 12B:
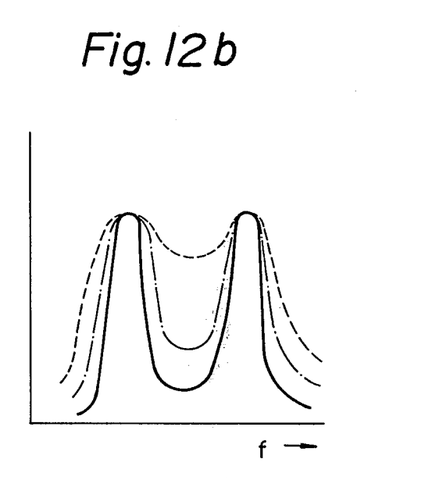

Each of the four input and output transducers comprises a pair of comb-shaped electrodes each of which has a number of electrode teeth 20, 20' formed on the substrate of piezoelectric material 7, as illustrated in FIG. 11. A desired filtering characteristic which allows wave bands of desired frequency to pass can be obtained by changing the length of each tooth electrode 20, 20' of the comb-shaped electrodes 22, 22' and/or changing the interdigitated length between every two adjacent teeth of the comb-shaped electrodes 22, 22' which face each other. Each of the comb-shaped electrodes 22, 22' has a land 21, 21' for being connected to another part through a lead wire. In a set of input and output transducers, the input transducer is formed in the shape which has a filtering characteristic as depicted by the dotted line in FIGS. 12($a$) and ($b$), while the output transducer is formed in a shape which has the filtering characteristic as depicted by a dash-dot line in FIGS. 12($a$) and ($b$). Thereby, it is possible to obtain the filtering characteristic as depicted by the solid line in FIGS. 12($a$) and ($b$) by the combination of the input transducer and the output transducer. FIG. 12($a$) represents the characteristic of filtering the picture signal. FIG. 12($b$) represents the characteristic of filtering the sound signal. By the above mentioned manner of obtaining the desired filtering characteristic through a set of input and output transducers, the desired characteristic can be easily and reliably obtained when compared with the manner in which the desired characteristic of the solid line in FIGS. 12(a) or (b) is obtained at one time by passing through the output transducer.

Figure 13:
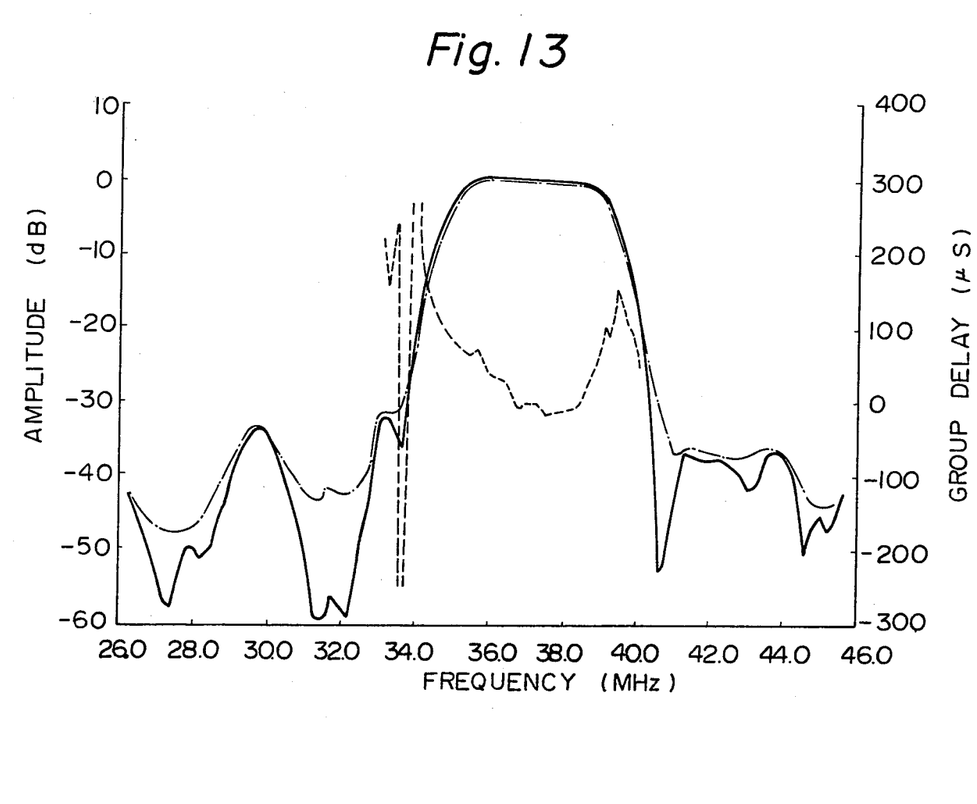
FIG. 13 is a graphical view of a picture signal obtained through the surface acoustic wave filter according to the present invention.
Figure 14:
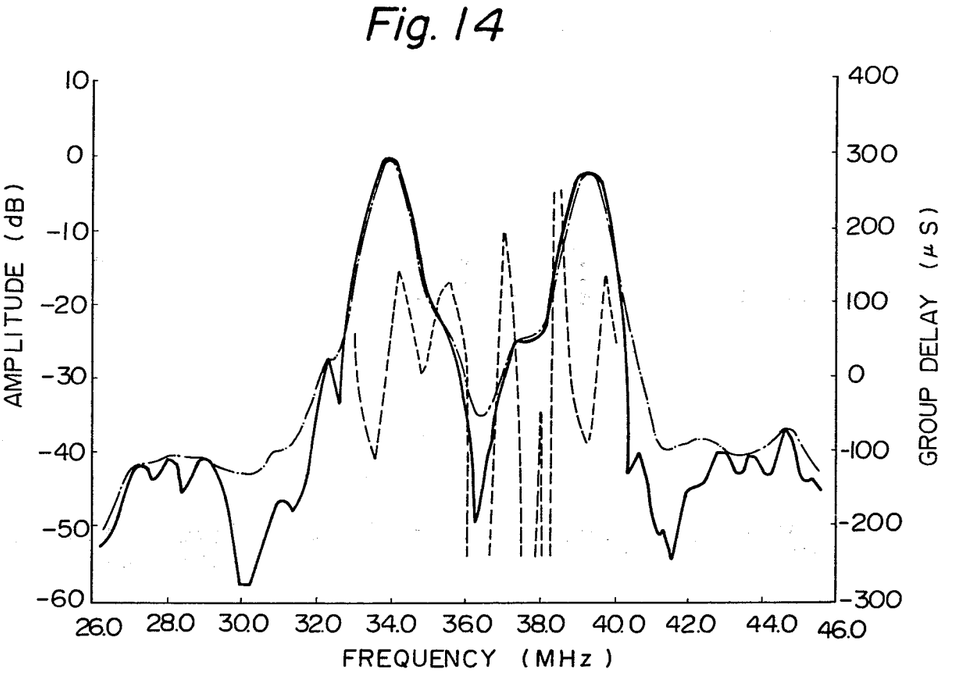
FIG. 14 is a graphical view of a sound signal and picture carrier obtained through the surface acoustic wave filter according to the present invention.

FIG. 13 and FIG. 14 are graphical views of the picture signal and the sound signal obtained through the surface acoustic wave filter. In each of the graphs, the solid line represents the amplitude characteristic with respect to the frequency, the dotted line represents the group delay characteristic corresponding to the change of phase, and the dash-dot line represents the amplitude characteristic of the prior art. In the amplitude characteristic of the present invention, the signal is sharply removed at the foot portions at both sides of the raised up portion of the graphs when compared with the characteristic of the prior art, since the bulk waves do not affect the filtering characteristic in the present invention and both the input and output transducers can be suitablly designed according to the requested responses, respectively. Therefore, stable and reliable function of the filter can be obtained.

Figure 9:
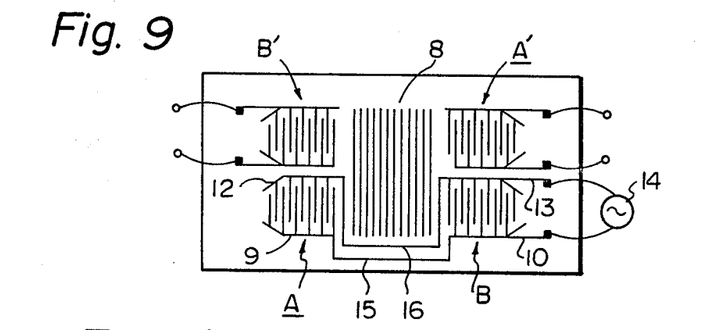
FIG. 9 is a plan view of another embodiment of the present invention.

Another embodiment of the present invention is illustrated in FIG. 9. In this embodiment, constructions of the multistrip coupler 8 and individual transducers A, A', B, B' are the same as those of the embodiment of FIG. 8. The difference resides in the connection manner between the two input transducers, i.e., the electrode terminal 9 of the input transducer A and the electrode terminal 10 of the other input transducer B are interconnected through a connection pattern 15 and the electrode terminal 12 of the input transducer A and the electrode terminal 13 of the other input transducer B are interconnected through a connection pattern 16 so that the two input transducers A, B are connected in parallel. The input signal 14 is introduced between the terminals 10 and 13 or between the terminals 9 and 12. The same function and effect as those of the embodiment of FIG. 8 are obtained in this embodiment.

As mentioned above, in the surface acoustic wave filter according to the present invention, an input signal is divided into two signals which are transmitted in opposite directions into the corresponding output transducers, respectively, through the multistrip coupler as surface acoustic waves without transmission loss of the signal. The affection of unnecessary bulk waves are avoided without providing vacant spaces in front of the input transducers. Therefore, it is possible to upgrade the filtering characteristic in a compact arrangement of the transducers of the surface acoustic wave filter.

We claim:

1. A surface acoustic wave filter comprising:
    a substrate of piezoelectric material;
    a multistrip coupler for changing the track of a signal comprising a plurality of parallel conductive strips;
    at least two transducers disposed on one side of said multistrip coupler; and
    at least another two transducers disposed on the other side of said multistrip coupler, the latter two transducers facing the former two transducers in which one pair of said transducers which face each other through said multistrip coupler constitute input transducers while the other pair of said transducers constitute output transducers, and in which said pair of output transducers are electrically disconnected from each other so that each output transducer receives an acoustic wave signal of different frequency.

2. A surface acoustic wave filter according to claim 1, wherein the filter comprises two input transducers which face each other through said multistrip coupler and two output transducers which face each other through said multistrip coupler.

3. A surface acoustic wave filter according to claim 1, wherein each of said transducers comprises a pair of interdigitated comb-shaped electrodes.

4. A surface acoustic wave filter according to claim 3, wherein in a set of transducers comprising one input transducer and one output transducer, each one of the transducers has a frequency filtering characteristic substantially similar to that of the other.

5. A surface acoustic wave filter according to claim 4, wherein the filter comprises two sets of transducers, each set comprising one input transducer and one output transducer, one of said sets having a frequency filtering characteristic corresponding to a picture signal frequency characteristic of a TV signal and the other of said sets having a frequency filtering characteristic corresponding to a sound signal frequency characteristic of said TV signal.

6. A surface acoustic wave filter according to claim 2, wherein said two input transducers are electrically interconnected in series.

7. A surface acoustic wave filter according to claim 2, wherein said two input transducers are electrically interconnected.

8. An improved surface acoustic wave filter comprising:
    a substrate of piezoelectric material;
    coupler means for changing the track of a signal formed on said substrate;
    two transducers formed on said substrate to one side of said coupler means; and
    another two transducers formed on said substrate to the other side of said coupler means with the latter two transducers facing the former two transducers;
    one pair of said transducers which face each other through said coupler means comprise input transducers while the other pair of said transducers comprise output transducers, wherein said pair of output transducers are electrically disconnected from each other so that each output transducer receives an acoustic wave signal of different frequency.

9. An improved surface acoustic wave filter as set forth in claim 8, wherein each of said transducers has a pair of interdigitated comb-shaped electrodes.

10. An improved surface acoustic wave filter as set forth in claim 9, wherein in a set of transducers comprising one input transducer and one output transducer, each one of the respective transducers has a frequency filtering characteristic substantially similar to that of the other.

11. An improved surface acoustic wave filter as set forth in claim 9, wherein the filter comprises two sets of transducers with each set comprising one input transducer and one output transducer, one of said sets having a frequency filtering characteristic corresponding to a picture signal frequency characteristic of a TV signal and the other of said sets having a frequency filtering characteristic corresponding to a sound signal frequency characteristic of said TV signal.

12. An improved surface acoustic wave filter as set forth in claim 8, wherein the filter comprises two input transducers which face each other through said coupler means and two output transducers which face each other through said coupler means.

13. An improved surface acoustic wave filter as set forth in claim 12, in which said two input transducers are electrically interconnected in series.

14. An improved acoustic wave filter as set forth in claim 12, in which said two input transducers are electrically interconnected in parallel.

* * * * *

UNITED STATES PATENT AND TRADEMARK OFFICE
CERTIFICATE OF CORRECTION

PATENT NO. : 4,420,730

DATED : Dec. 13, 1983

INVENTOR(S) : Wakatsuki et al.

Page 1 of 2

It is certified that error appears in the above-identified patent and that said Letters Patent is hereby corrected as shown below:

Column 1, line 52, "necesserily" should be --necessarily--;

Column 1, line 52, "the" should be --a--.

Column 2, line 25, "transducers" should be --transducer--.

Column 3, line 15, "said" should be --the--;

Column 3, line 29, delete "a".

Column 4, line 4, "A,B'" should be --$\underline{A},\underline{B}'$--;

Column 4, line 5, "A',B" should be --$\underline{A}',\underline{B}$--;

Column 4, line 7, "A',B" should be --$\underline{A}',\underline{B}$--; "A" should be --$\underline{A}$--;

Column 4, line 8, "B'" should be --$\underline{B}'$--; delete "said"; "A and B" should be --$\underline{A}$ and $\underline{B}$--;

Column 4, line 10, delete "said"; "A'" should be --$\underline{A}'$--;

Column 4, line 11, "B'" should be --$\underline{B}'$--;

Column 4, line 12, "A" should be --$\underline{A}$--;

Column 4, line 13, "B" should be --$\underline{B}$--;

Column 4, line 16, "A" should be --$\underline{A}$--; delete "12 of the other";

Column 4, line 17, delete "input transducer A and the other electrode terminal";

Column 4, line 18, "B" should be --$\underline{B}$--;

Column 4, line 22, "A" should be --$\underline{A}$--;

Column 4, line 23, "B" should be --$\underline{B}$--;

Column 4, line 24, "A" should be --$\underline{A}$--;

UNITED STATES PATENT AND TRADEMARK OFFICE
CERTIFICATE OF CORRECTION

PATENT NO. : 4,420,730

DATED : Dec. 13, 1983

INVENTOR(S) : Wakatsuki et al.

It is certified that error appears in the above-identified patent and that said Letters Patent is hereby corrected as shown below:

Column 4, line 25, "A'" should be --$\underline{A}$'--;
Column 4, line 27, "B" should be --$\underline{B}$--;
Column 4, line 28, "B'" should be --$\underline{B}$'--;
Column 4, line 30, "A,A'" should be --$\underline{A},\underline{A}$'--;
Column 4, line 36, "B,B'" should be --$\underline{B},\underline{B}$'--;
Column 4, line 40, "A,B" should be --$\underline{A},\underline{B}$--;
Column 4, line 41, "A',B'" should be --$\underline{A}$',$\underline{B}$'--;
Column 4, line 59, "a" should be --the--; "the" should be --a--.
Column 5, line 20, "suitablly" should be --suitably--;
Column 5, line 25, "A" should be --$\underline{A}$--;
Column 5, line 26, "A',B,B'" should be --$\underline{A}$',$\underline{B},\underline{B}$'--;
Column 5, line 29, "A" should be --$\underline{A}$--;
Column 5, line 30, "B" should be --$\underline{B}$--;
Column 5, line 32, "A" should be --$\underline{A}$--;
Column 5, line 33, "B" should be --$\underline{B}$--;
Column 5, line 35, "A,B" should be --$\underline{A},\underline{B}$--.

Signed and Sealed this

Fifth Day of March 1985

[SEAL]

Attest:

DONALD J. QUIGG

*Attesting Officer*  *Acting Commissioner of Patents and Trademarks*